(12) United States Patent
Groot

(10) Patent No.: US 7,527,441 B2
(45) Date of Patent: May 5, 2009

(54) CAMERA MODULE, HOLDER FOR USE IN A CAMERA MODULE, CAMERA SYSTEM AND METHOD OF MANUFACTURING A CAMERA MODULE

(75) Inventor: Erik Harold Groot, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 735 days.

(21) Appl. No.: 10/521,259

(22) PCT Filed: Jul. 11, 2003

(86) PCT No.: PCT/IB03/03198

§ 371 (c)(1),
(2), (4) Date: Jan. 13, 2005

(87) PCT Pub. No.: WO2004/010687

PCT Pub. Date: Jan. 29, 2004

(65) Prior Publication Data

US 2005/0251050 A1 Nov. 10, 2005

(30) Foreign Application Priority Data

Jul. 18, 2002 (EP) .................... 02077931

(51) Int. Cl.
*G03B 17/00* (2006.01)
(52) U.S. Cl. ...................... 396/529; 348/373
(58) Field of Classification Search .............. 396/529; 348/335, 340, 373–376; 250/208.1, 239; 257/432, 433
See application file for complete search history.

(56) References Cited

U.S. PATENT DOCUMENTS

| 5,783,815 | A | | 7/1998 | Ikeda |
| 6,122,009 | A | * | 9/2000 | Ueda ........................... 348/335 |
| 6,900,913 | B2 | * | 5/2005 | Chen ........................... 358/474 |
| 2004/0080658 | A1 | * | 4/2004 | Cambou et al. ............. 348/340 |
| 2005/0242410 | A1 | * | 11/2005 | Groot et al. ................. 257/433 |

FOREIGN PATENT DOCUMENTS

| EP | 1081944 | 3/2001 |
| JP | 20004386 A | 1/2000 |
| JP | 2001188155 A | 7/2001 |
| JP | 2002118776 A | 4/2002 |
| WO | WO02075815 A1 | 9/2002 |

* cited by examiner

*Primary Examiner*—W. B. Perkey

(57) ABSTRACT

The invention relates to a camera module 100. The camera module 100 comprises a holder 102, which provides a light-conducting channel 121. Within the light-conducting channel 121 a lens 112 having an optical axis 106 is present. A solid-state image sensor 113 is present near an end 122 of the light-conducting channel 121. The image sensor 113 is provided with an image pick-up section 114, which is oriented perpendicularly to the optical axis 106. Near the end 122 of the light-conducting channel, forming part of the holder 102, aligning means 131 are present for aligning the image pick-up section 114 with the optical axis 106. In one embodiment of the camera module 100, the inner wall 130 of the holder 102 is substantially rectangular, seen in cross-sectional view in a direction perpendicular to the optical axis 106. Bulges 131 present near the corners of the rectangle form the aligning means. The bulges 131 are provided with L-shaped recesses 132 in which the lateral surfaces 125 of the solid-state image sensor 113 are placed substantially without play. This method of aligning the image pick-up section 114 with the optical axis 106 simplifies the manufacture of the camera module 100.

11 Claims, 9 Drawing Sheets

Figure 1A:
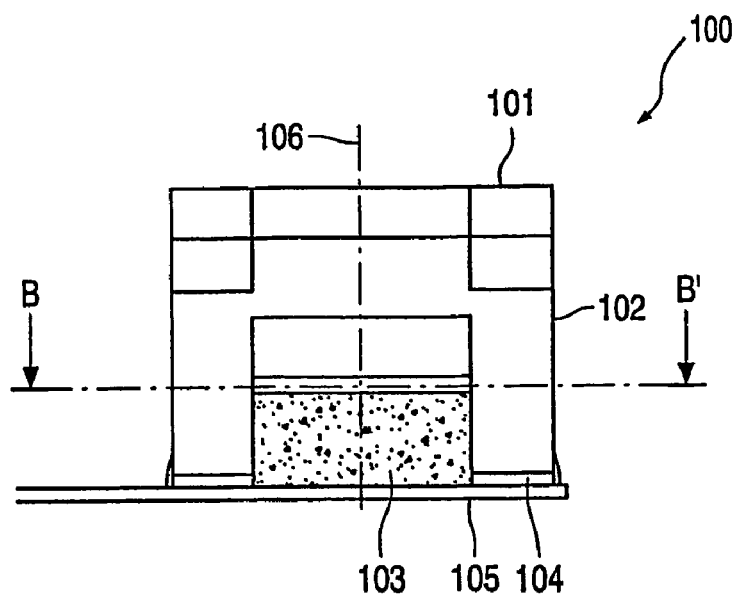

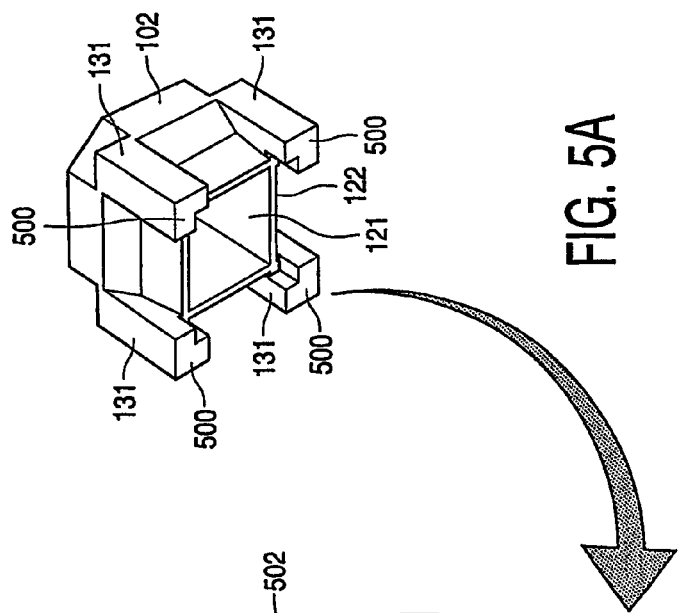
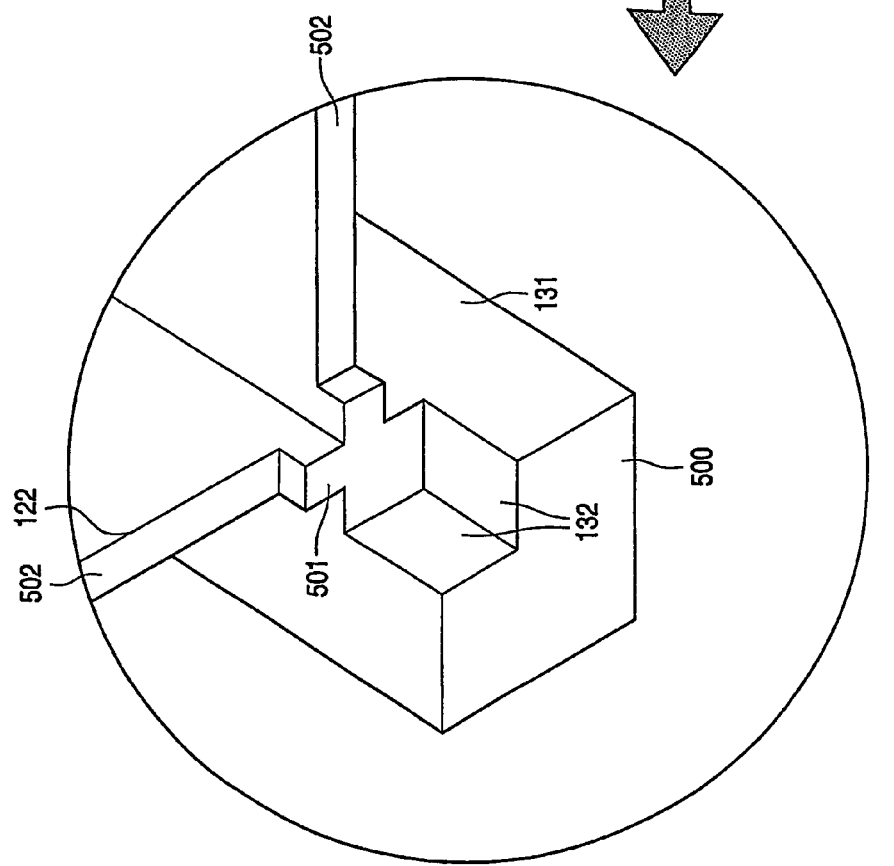

CAMERA MODULE, HOLDER FOR USE IN A CAMERA MODULE, CAMERA SYSTEM AND METHOD OF MANUFACTURING A CAMERA MODULE

The invention relates to a camera module comprising a holder provided with a light-conducting channel, within which channel a lens having an optical axis is present, a solid-state image sensor being present near an end of said light-conducting channel, which image sensor comprises an image pick-up section oriented perpendicularly to the optical axis.

The invention also relates to a holder provided with a light-conducting channel intended for use in a camera module, which is arranged for accommodating a lens having an optical axis and which is furthermore arranged for placing a solid-state image sensor comprising an image pick-up section near an end of the light-conducting channel.

The invention also relates to a camera system comprising a camera module with a holder.

The invention furthermore relates to a method of manufacturing a camera module comprising a holder.

Such a camera module is known from European patent application EP-A 1 081 944. The known camera module is suitable for use in a camera system, such as a camera system incorporated in a telephone, in a portable computer or in a digital photo or video camera. With the known camera module, an image pickup module is placed into abutment with the second end of the holder. The image pickup module of the known camera module comprises a substrate. Present on the side of the substrate facing away from the holder, on which an electrically conductive wiring pattern has been formed, is a solid-state image sensor, for example a CCD (Charge Coupled Device) image sensor or a CMOS (Complementary Metal Oxide Semiconductor) image sensor. The solid-state image sensor is electrically connected to further electronics in a camera system of which the camera module forms part by means of electrically conductive connections, for example in the form of bumps of a suitably selected material, such as gold or another electrically conductive material. One side of the solid-state image sensor facing towards the substrate comprises a light-sensitive area arranged for converting incident light into electrical signals.

In one embodiment of the known camera module, the substrate consists of a non-transparent material, for example a metal plate covered with a flexible foil on which said wiring pattern is present, in which plate an aperture is present for transmitting light to the light-sensitive area of the solid-state image sensor. In another embodiment, the substrate consists of a light-transmitting material, such as glass, on which a conductive wiring pattern is present on the side facing towards the solid-state image sensor.

One drawback of the known camera module is the fact that it requires a complicated manufacturing method, which renders the camera module relatively costly.

It is an object of the invention to provide a camera module designed to enable simple manufacture. This object is achieved with a camera module according to the introductory paragraph, which is characterized in that aligning means forming part of the holder are present near the end of the light-conducting channel, which aligning means align the image pick-up section with respect to the optical axis.

In the camera module according to the invention, the position of the solid-state image sensor in the holder is fixed by the aligning means. Thus the position of the image pick-up section with respect to the optical axis is fixed as well. During manufacture it suffices, therefore, to place the solid-state image sensor in the holder, using the aligning means, in order to align the image pick-up section with respect to the optical axis. This results in a simplification of the manufacture of the camera module.

Furthermore it can be noted that the solid-state image sensor of the camera module according to the invention is not accommodated in an image pickup module, as is the case with the known camera module. Instead, the solid-state image sensor can be placed directly in the holder. This in itself already results in a simplification of the manufacture of the camera module. An additional result is that a reduction of the dimensions of the camera module is obtained, in particular in a direction parallel to the optical axis. This is an advantage, too, since the amount of available space is very limited in many applications in which the camera module is used, and in all probability it will be reduced even further in future applications.

One embodiment of the camera module according to the invention is characterized in that the image pick-up section extends in a plane parallel to a main surface of the solid-state image sensor, in which the solid-state image sensor comprises lateral surfaces oriented at least substantially perpendicularly to the main surface, and in which the holder comprises an outer wall which is at least substantially polygonal near the end, seen in sectional view in a direction perpendicular to the optical axis, in which the aligning means comprise bulges present on the outer wall, near the corners of said polygon, which bulges extend beyond the end of the light-conducting channel, having an inner side which abuts against at least one of the lateral surfaces of the solid-state image sensor, as a result of which the solid-state image sensor is contained within the holder substantially without play in a direction perpendicular to the optical axis.

Since the bulges ensure that substantially no play remains between the inner wall of the holder and the lateral surfaces of the solid-state image sensor, the position of the solid-state image sensor and thus the position of the image pick-up section is fixed in a plane perpendicular to the optical axis of the lens. Thus it suffices to place the solid-state image sensor between the bulges, with the main surface extending perpendicularly to the optical axis and facing towards the lens, in order to align the image pick-up section with respect to the optical axis. This leads to a further simplification of the manufacture of the camera module as regards the alignment of the image pick-up section with respect to the optical axis.

Another embodiment of the camera module according to the invention is characterized in that the inner side of the bulges comprises an L-shaped recess, as a result of which each bulge abuts substantially without play against two mutually adjacent lateral surfaces of the solid-state image sensor.

When the bulges are configured in this way, it will be easier to place the solid-state image sensor between bulges with the main surface extending perpendicularly to the optical axis and facing towards the lens. This leads to a further simplification of the manufacture of the camera module as regards the alignment of the image pick-up section with respect to the optical axis.

Another embodiment of the camera module according to the invention is characterized in that the recesses furthermore each comprise a surface extending parallel to a plane perpendicular to the optical axis, which surfaces jointly form an abutting surface against which the main surface of the solid-state image sensor abuts substantially without play, thereby determining the distance from the image pick-up section to the lens.

Once the solid-state image sensor is mounted in the holder, the main surface of the solid-state image sensor extends parallel to the abutting surface against which it abuts. As a result, the image pick-up section of the solid-state image sensor extends parallel to the abutting surface, too. The abutting surface is oriented perpendicularly to the optical axis. Thus it is achieved that the image pick-up section will be oriented perpendicularly to the optical axis after the solid-state image sensor has been placed. This orientation leads to an improved quality of the images being projected onto the image pick-up section by the lens in use. This leads to a further simplification of the manufacture of the camera module.

In this way it is furthermore achieved that the image pick-up section can be positioned a predetermined distance away from the lens. If the tolerances in the dimensions of the lens and the barrel are sufficiently small, it may no longer be necessary to focus the lens upon mounting the barrel in the holder. Generally, focusing is a time-consuming step that must be carried out with due precision. Thus, the omission of this step will result in a simplification of the manufacture of the camera module.

Another embodiment of the camera module according to the invention is characterized in that further recesses are present in the holder near the end of the light-conducting channel, as a result of which the main surface of the solid-state image sensor does not make contact with the holder at the location of the recesses.

The provision of said recesses achieves that any unevennesses in the main surface of the solid-state image sensor or in the end of the light-conducting channel may lead to mechanical stresses in the solid-state image sensor. Such stresses may reduce the life of the solid-state image sensor or even cause damage to the solid-state image sensor.

Another embodiment of the camera module according to the invention is characterized in that the main surface of the solid-state image sensor and the polygon are at least substantially identical in shape, with the polygon having a smaller surface area, as a result of which a part of the main surface located near the lateral surfaces lies further away from the optical axis than, near the end of the light-conducting channel, the outer wall of the holder.

An advantage of this configuration is that the bonding wires, which electrically connect the integrated circuits on the solid-state image sensor to other electronics present in a camera system and which are mechanically fairly vulnerable, can be entirely covered with glob top material in this way, which glob top material strengthens the connection between the holder and the substrate to which the holder is attached.

A holder according to the invention for use in a camera module provided with a light-conducting channel, which is arranged for accommodating a lens having an optical axis and which is furthermore arranged for placing a solid-state image sensor comprising an image pick-up section near an end of the light-conducting channel is characterized in that aligning means forming part of the holder are present near said end of the light-conducting channel for aligning the image pick-up section with respect to the optical axis.

In the holder according to the invention, the position at which the solid-state image sensor comprising the image pick-up section is to be placed is fixed by the aligning means. Thus, the position of the image pick-up section with respect to the optical axis is fixed as well. Upon manufacture of the camera module it thus suffices to place the solid-state image sensor in the holder, using the aligning means, in order to align the image pick-up section with respect to the optical axis. Consequently, the manufacture of the camera module is simplified by using the holder according to the invention when manufacturing the camera module.

A camera system according to the invention comprises a camera module comprising a holder provided with a light-conducting channel in which a lens having an optical axis is present, in which a solid-state image sensor provided with an image pick-up section oriented perpendicularly to the optical axis is present near an end of the light-conducting channel, and in which aligning means forming part of the holder are present near said end of the light-conducting channel for aligning the image pick-up section with respect to the optical axis.

The camera system according to the invention employs a camera module in which the position of the solid-state image sensor in the holder is fixed by the aligning means. Thus, the position of the image pick-up section with respect to the optical axis is fixed as well. During manufacture it suffices, therefore, to place the solid-state image sensor in the holder, using the aligning means, in order to align the image pick-up section with respect to the optical axis. This results in a simplification of the manufacture of the camera system.

A method of manufacturing a camera module comprising a holder is characterized in that the holder is provided with aligning means, in which the solid-state image sensor comes into contact with the aligning means upon placement of the solid-state image sensor in said holder, as a result of which an image pick-up section present on the solid-state image sensor is aligned with respect to an optical axis.

During manufacture, a lens having an optical axis is placed in the holder. For a correct operation of the camera module it is important that the solid-state image sensor is aligned with respect to the optical axis in a plane perpendicular to the optical axis. In order to achieve this, the camera module is provided with aligning means upon manufacture. Automatic alignment of the image pick-up section with respect to the optical axis is achieved by placing the solid-state image sensor into contact with the aligning means upon placement of the solid-state image sensor in the holder. This results in a simplification of the manufacture of the camera system.

Figure 2A:
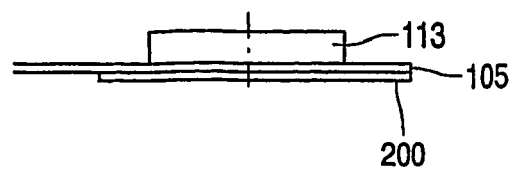
Figure 2B:
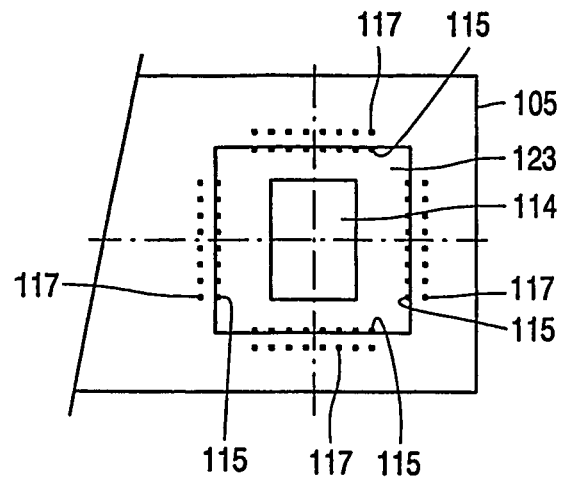
Figure 2C:
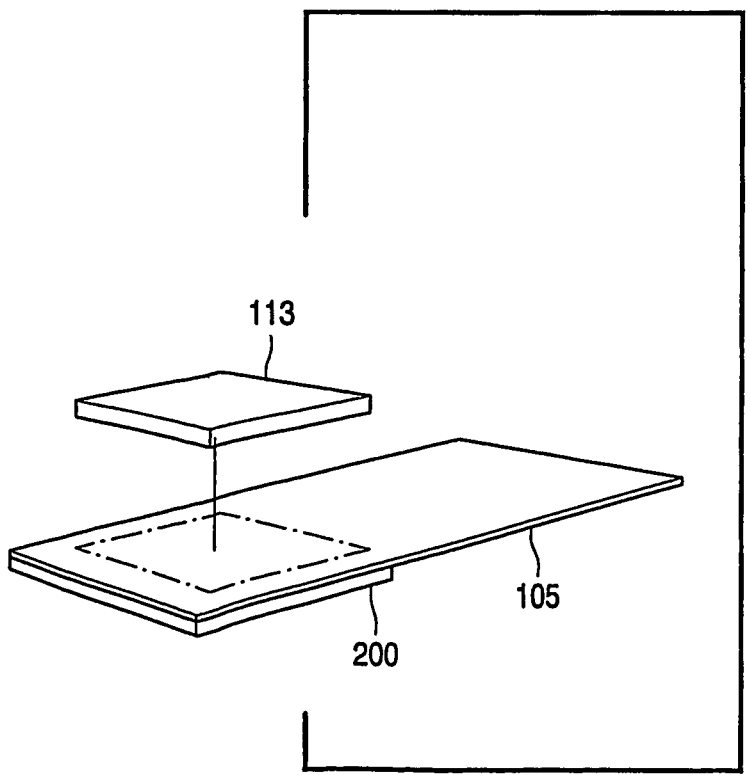
Figure 3A:
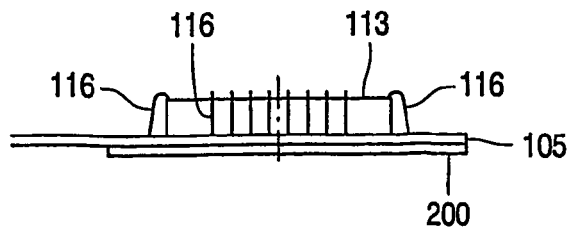
Figure 3B:
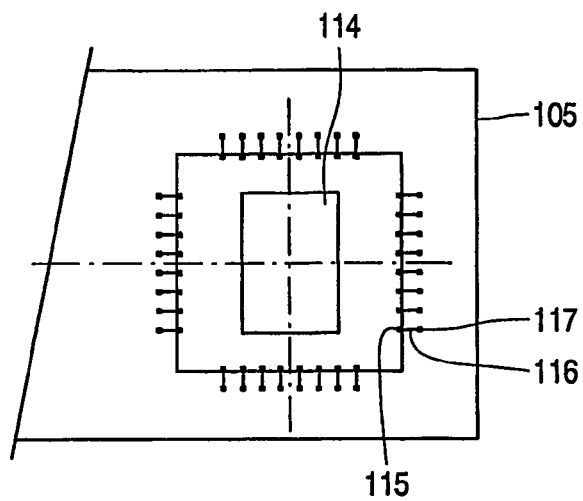
Figure 3C:
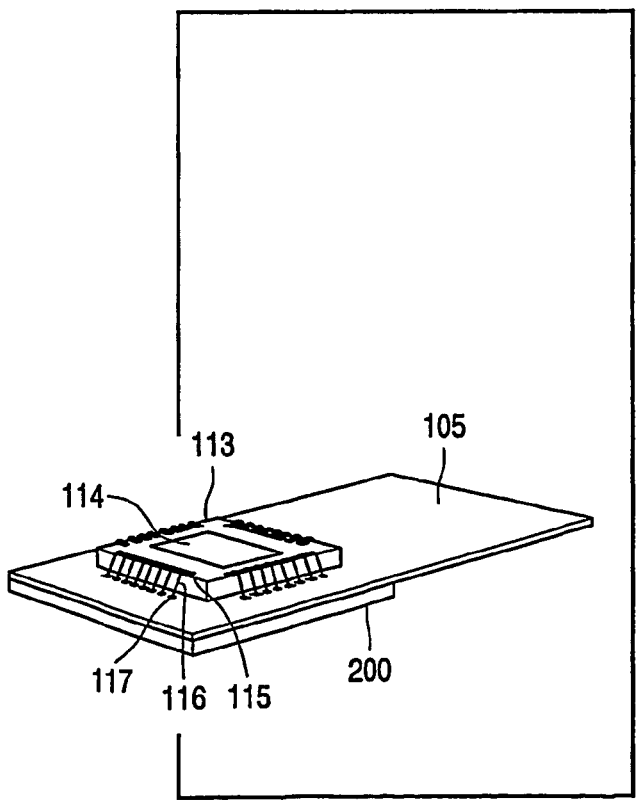
Figure 4A:
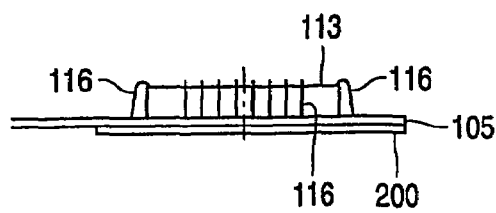
Figure 4B:
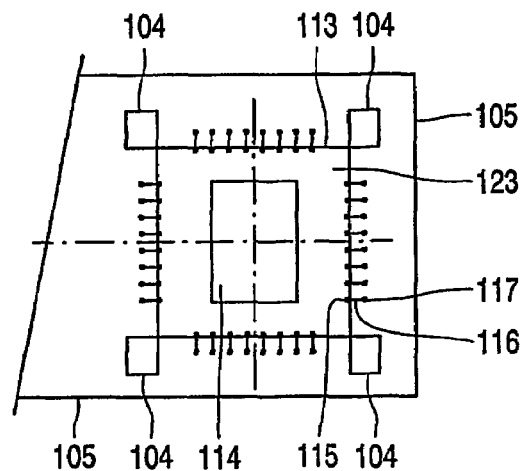
Figure 4C:
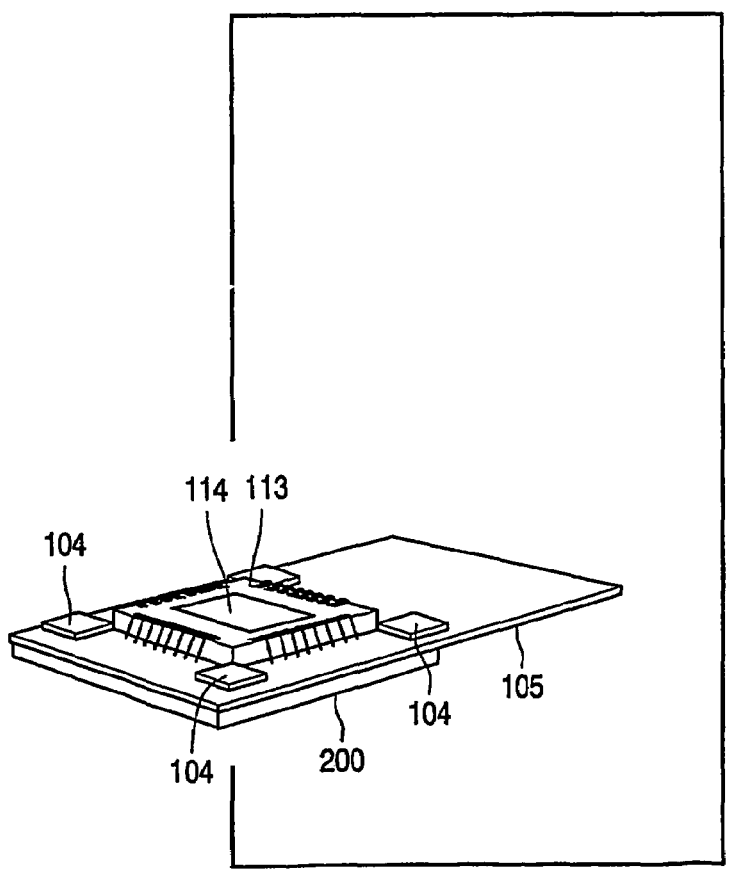
Figure 6A:
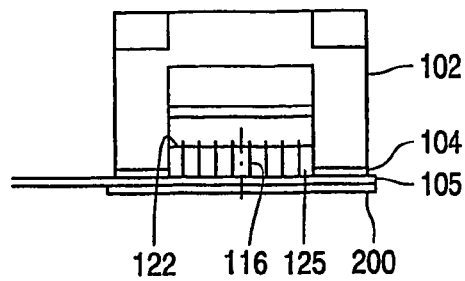
Figure 6B:
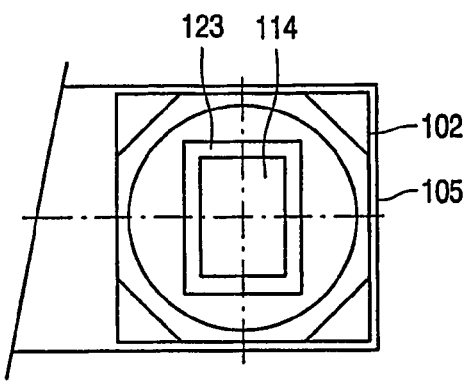
Figure 6C:
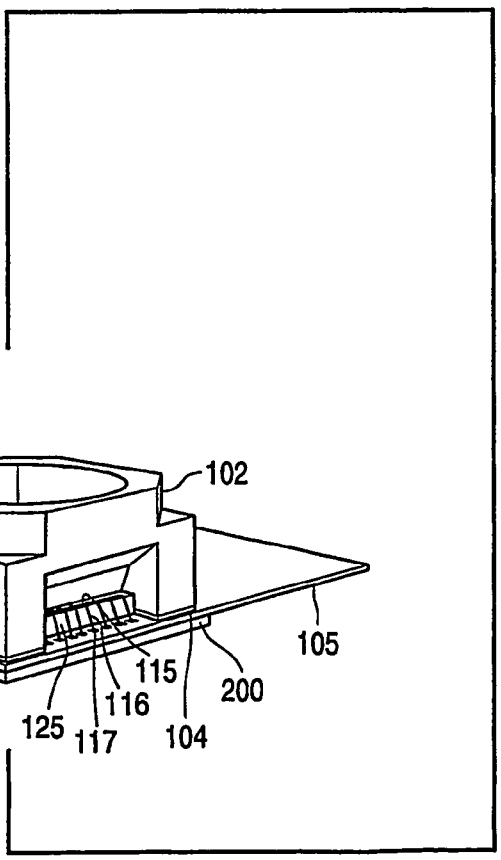
Figure 7A:
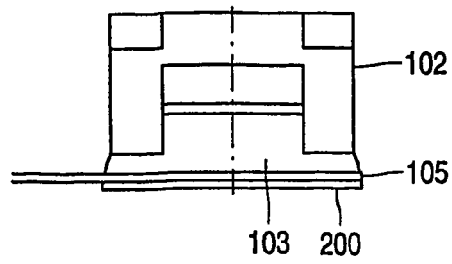
Figure 7B:
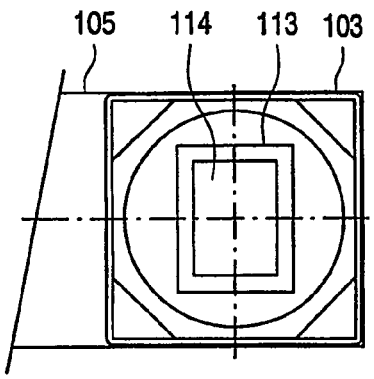
Figure 7C:
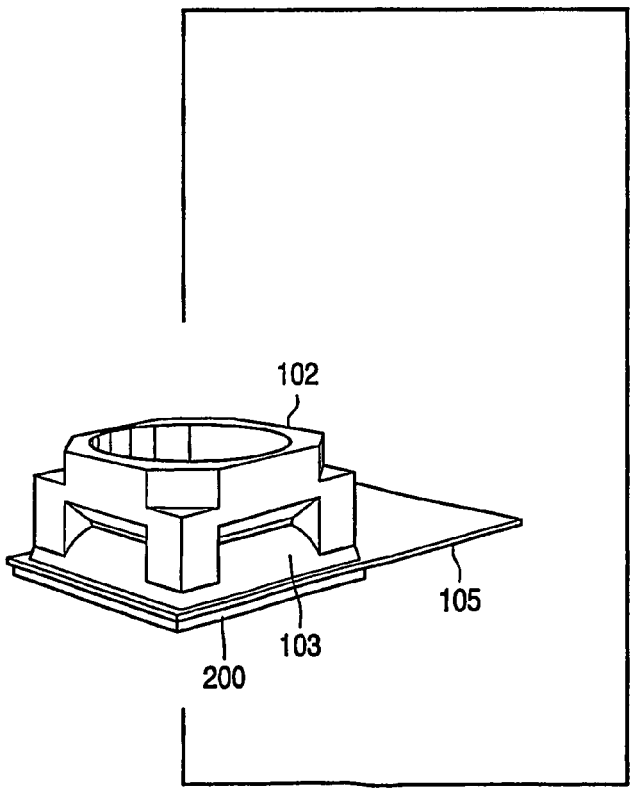
Figure 8A:
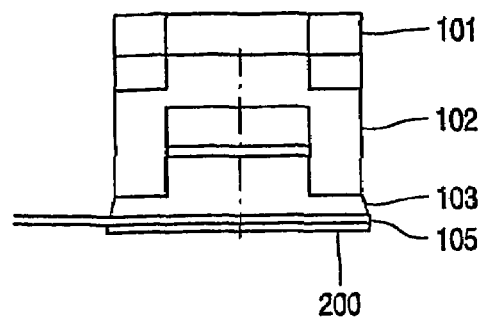
Figure 8B:
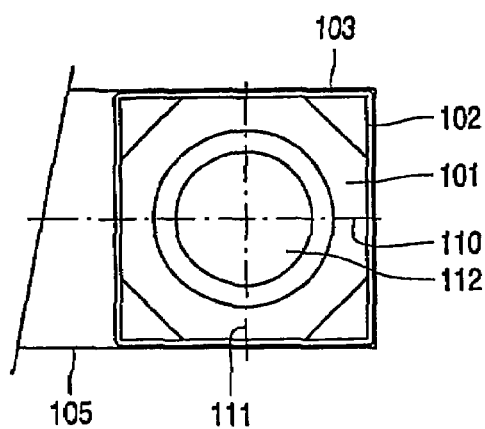
Figure 8C:
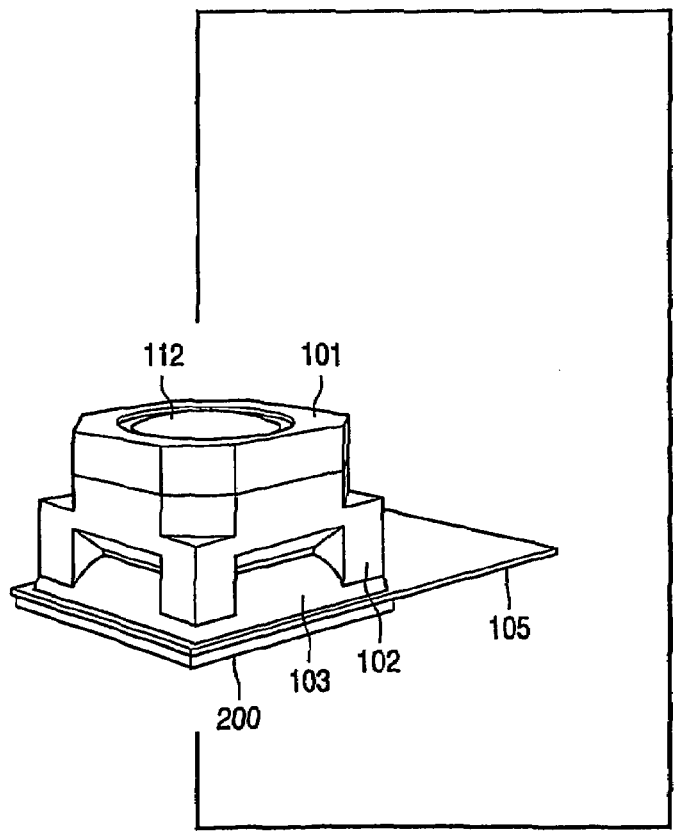

These and other aspects of the invention will now be discussed in more detail with reference to the drawings, in which:

FIGS. 1A-D schematically show an embodiment of the camera module according to the invention;

FIGS. 2A-C schematically show a manufacturing step of the camera module according to the invention;

FIGS. 3A-C schematically show a further manufacturing step of the camera module according to the invention;

FIGS. 4A-C schematically show a further manufacturing step of the camera module according to the invention;

FIGS. 5A-B schematically show a further manufacturing step of the holder of the camera module;

FIGS. 6A-C schematically show a further manufacturing step of the camera module according to the invention;

FIGS. 7A-C schematically show a further manufacturing step of the camera module according to the invention; and FIGS. 8A-C schematically show a further manufacturing step of the camera module according to the invention.

In these figures, like parts are indicated by the like numerals.

FIGS. 1A-D schematically show an embodiment of the camera module according to the invention. FIG. 1A is a side elevation of a camera module 100 according to the invention. The camera module comprises a barrel 101 which is mounted in a holder 102, a substrate 105 of a flexible material (a flex foil), to which the holder 102 is attached by means of an adhesive material 104, and a seal 103 consisting of glob top material for sealing the interior of the holder. The adhesive material 104 is a suitably selected glue, for example. The optical axis of the camera module is illustrated in the broken line 106. A usual height of the camera module, measured from the barrel 101 to the substrate 105, is about 5.0-5.5 mm, for example. A usual diameter of the barrel is about 5.5-6.0 mm, for example. Other dimensions are also possible, however. This depends inter alia on the diameter and the focal distance of the lens.

Figure 1B:
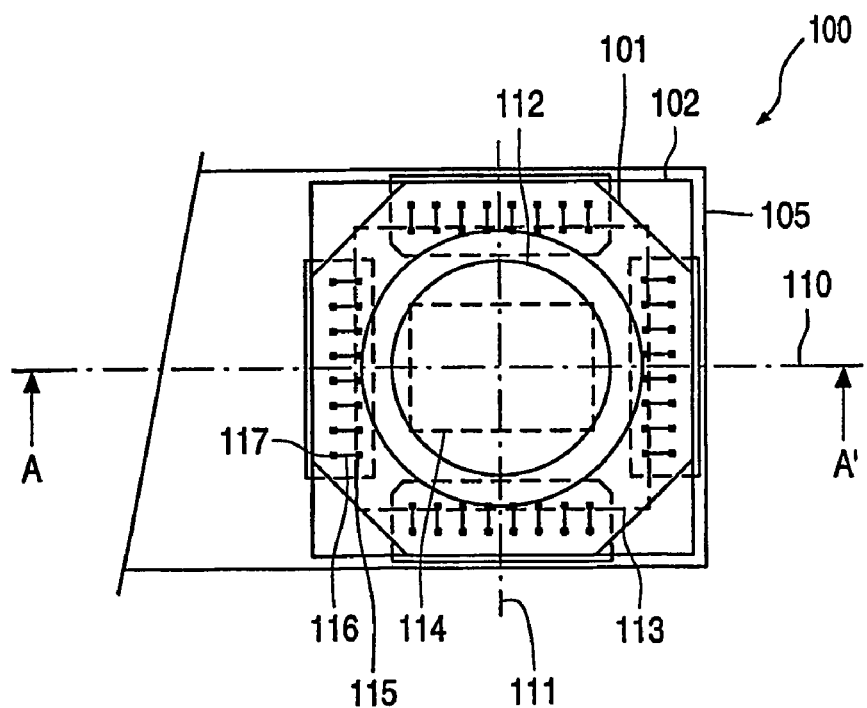

FIG. 1B shows the camera module 100 in top plan view. The figure shows the substrate 105, the holder 102 and the barrel 101. The optical axis 106 is represented by the point of intersection of the lines 110 and 111. In addition to that, the holder 102 has a central axis. After assembly of the camera module, it coincides with the optical axis 106 in the illustrated embodiment of the camera module. In FIG. 1B said central axis, like the optical axis, is represented by the point of intersection of the lines 110 and 111. FIG. 1B also shows a lens 112 present in the barrel 101. Furthermore, FIG. 1B shows a solid-state image sensor 113 with an image pick-up section 114 present thereon. The solid-state image sensor 113 is provided with bond pads 115, which electrically connect the integrated electronic circuits on the solid-state image sensor 113 to pads 117 on the substrate via bonding wires 116. The pads 117 can be connected to other electronic circuits and to a power supply, for example a battery or the output of a mains adapter, in a camera system by means of a pattern of conductive tracks. In this way the solid-state image sensor 113 can be supplied with the required electric voltages, and electrical signals, which are generated by the incident light in the image pick-up section 114, for example, can be transmitted to the other electronic circuits in the camera system. A usual length of the holder 102 is about 6.5-7.0 mm, for example. A usual width of the holder 102 is about 6.0-6.5 mm, for example. Other dimensions are also possible, however. This depends inter alia on the dimensions of the image pick-up section 114, which are in turn determined inter alia by the dimensions of the number of pixels in the image pick-up section 114 and the dimensions of the individual pixels.

Figure 1C:
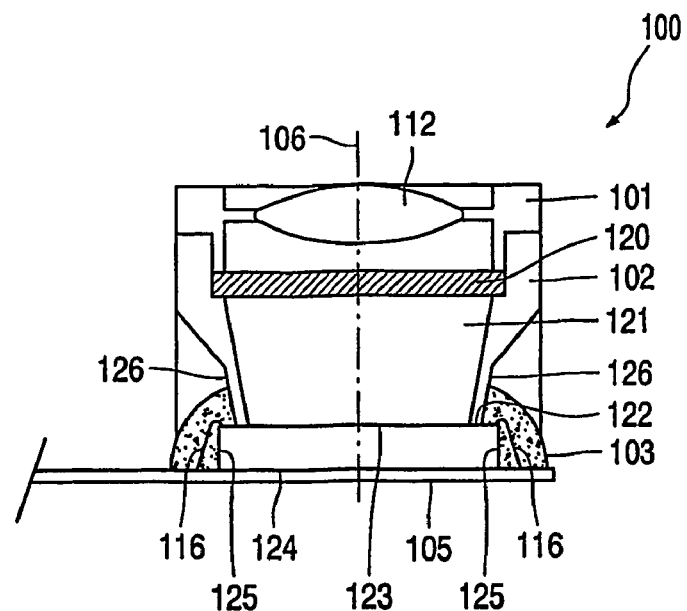

FIG. 1C is a longitudinal sectional view of the camera module 100 along the plane AA' in FIG. 1B, which is oriented parallel to the optical axis 106. The figure shows the barrel 101 containing the lens 112 and an infrared filter 120. The barrel 101 is mounted in the holder 102. The holder has an outer wall 126. Inside the holder 102 is a light-conducting channel 121 having an end 122. As is shown in FIG. 1C, the diameter of the light-conducting channel 121 decreases in a direction from the lens 112 to the solid-state image sensor, in that the distance between the outer wall 126 and the optical axis 106 becomes smaller and smaller. This also applies to the parts of the outer wall 126 that lie behind and in front of the plane of the longitudinal section. The diameter of the light-conducting channel near the end 122, seen in a direction perpendicularly to the optical axis 106, is smaller than the diameter of the solid-state image sensor 113, seen in a direction perpendicular to the optical axis 106. As a result, the end 122 of the light-conducting channel 121 is positioned opposite the main surface 123 of the solid-state image sensor 113. Disposed in abutment with on the outer wall 126 of the holder 102, near the point of attachment of the holder 102 to the substrate 105, is the glob top material 103 which strengthens the connection between the holder 102 and the substrate, which covers the bonding wires 116 and which seals the light-conducting channel. The solid-state image sensor 113 comprises a main surface 123, which faces towards the lens 112, and a second main surface 105, which is attached to the substrate 105 in a usual way. The main surface 123 and the second main surface 105 are oriented perpendicularly to the optical axis 106. FIG. 1C furthermore shows the lateral surfaces 125 of the solid-state image sensor 113. Said surfaces abut the main surface 123 and the second main surface 105, being oriented perpendicularly thereto. Finally, FIG. 1C also shows the bonding wires 116, which electrically connect the bond pads 115 that are shown in FIG. 1B to the pads 117. FIG. 1C furthermore shows the bonding wires 116, which electrically connect the bond pads 115 that are shown in FIG. 1B to the pads 117. As is furthermore shown in FIG. 1C, the outer wall 126 of the holder 102 is positioned so close to the optical axis 106 near the end 122 that the part of the main surface 123 near the lateral surfaces 125 of the solid-state image sensor 113, where the bond pads 115 are present, is positioned outside the holder 102.

Figure 1D:
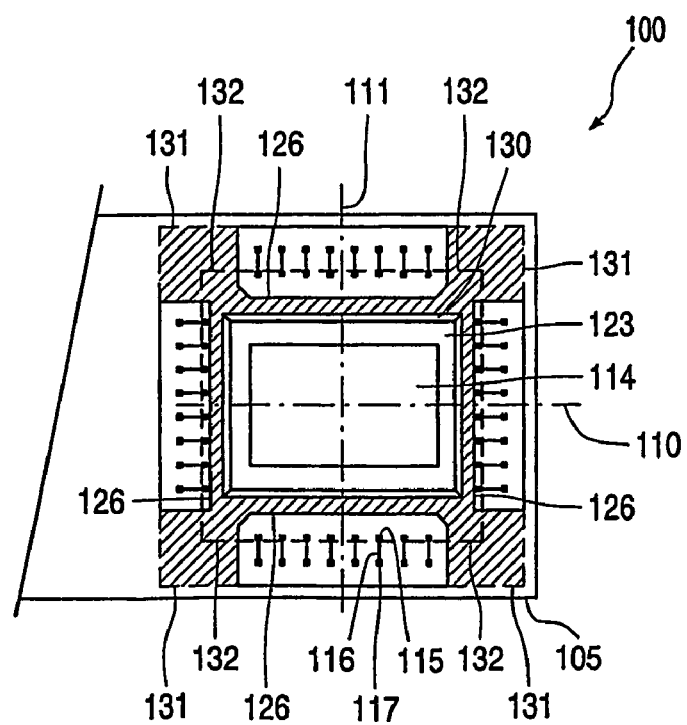

FIG. 1D is a cross-sectional view of the camera module 100 along the plane BB' in FIG. 1A, which plane is oriented perpendicularly to the optical axis 106. The figure shows the holder 102 and an inner wall 130 in cross-sectional view. The inner wall 130 is rectangular along the plane BB'. Disposed within this said rectangle is the solid-state image sensor 113, whose main surface 123 and the image pick-up section 114 present within the confines thereof is shown in top plan view. The main surface 123 is likewise rectangular, and it is enclosed by the inner wall 130. Bulges 131 are present near the corners of the rectangle formed by the cross-section of the inner wall. The bulges 131 extend beyond the end 122 of the light-conducting channel 121. The bulges 131 are provided with a recess 132 on the inner side, which recess is L-shaped in the cross-sectional view as shown. The L-shaped recesses 132 abut the lateral surfaces 125 of the solid-state image sensor 113 substantially without play. This achieves that the image pick-up section 114 is aligned with respect to the optical axis 106. Although this is in principle not necessary, the bulges 131 will usually be integral with the holder 102, since it simplifies the manufacture of the whole. As already mentioned with reference to FIG. 1C, space has furthermore been left for the pads 117 and the bonding wires 116 outside the area enclosed by the outer wall 126, seen in cross-sectional view, so that said pads and said bonding wires are disposed entirely outside the holder 102. A practical advantage of this configuration is the fact that the bonding wires 116, which are mechanically fairly vulnerable, can be completely covered with the glob top material 103 in this way, as is shown in FIG. 1C. To conclude, FIG. 1D shows the substrate 105.

A camera system in which the camera module 100 is used has this advantage that it can be small, since the dimensions of the camera module 100 are small in comparison with those of known camera modules. Another advantage of a camera system in which the camera module 100 is used is that it is cheaper to produce, since the camera module 100 is simpler and can thus be produced at lower cost than known camera modules.

FIGS. 2A-C schematically show a manufacturing step of the camera module according to the invention. FIG. 2A is a side elevation, in which the solid-state image sensor 113 is present on the substrate 105, with a stiffener 200 being present on the other side of the substrate 105. FIG. 2B is a top plan view of the solid-state image sensor 113 that is present on the substrate 105. Disposed within the confines of the main surface 123 of the solid-state image sensor 113 is the image pick-up section 114, as are the bond pads 115 being arranged in rows near the lateral surfaces 125 and extending parallel thereto. Present on the side of the substrate 105 to which the solid-state image sensor 113 is attached are also the pads 117. Said plans extend parallel to the lateral surfaces 125. FIG. 2C schematically shows in perspective view the placing of the solid-state image sensor 113 on the substrate 105.

It is common practice to test the functionality of the solid-state image sensor 113 before starting the assembly of the camera module 100. Normally, this takes place while the solid-state image sensor 113 is still present on a wafer. After such a functional test has been carried out, the wafer is diced. The solid-state image sensors 113 that have passed the functional test are subsequently used in the manufacture of the camera module 100. This prevents non-functioning solid-state image sensors 113 being used upon manufacture of camera modules.

An adhesive is applied to the flex foil substrate 105 before the solid-state image sensor 113 is bonded to the substrate 105. Said adhesive may be a usual glue or a PSA foil. Subsequently, the solid-state image sensor 113 is placed on the substrate by means of a pick and place machine, and the second main surface 105 is placed into contact with the substrate. Following this, the adhesive is cured.

FIGS. 3A-C schematically show a manufacturing step of the camera module according to the invention. FIG. 3A is a side elevation which shows, in addition to the elements that are shown in FIG. 2A, the bonding wires 116 that connect the bond pads 115 (not shown) to the pads 117 (likewise not shown) on the substrate 105. FIG. 3B is a top plan view which shows, in addition to the elements that are shown in FIG. 2B, the bonding wires 116 that connect the bond pads 115 to the pads 117 on the substrate. FIG. 3C is a schematic, perspective view of the solid-state image sensor 113 provided with the image pick-up section 114, which is present on the substrate 105, in which the bond pads 115 of the solid-state image sensor 113 are connected to the pads 117 on the substrate by means of the bonding wires 116.

After curing of the adhesive by means of which the solid-state image sensor 113 is attached to the substrate 105, the bonding wires 116 that electrically connect the bond pads 115 to the pads 117 are provided. It may be advantageous in that connection if the stiffener 200 is present. As a result of the presence of said stiffener, the assembly consisting of the solid-state image sensor 113 and the substrate is easier to handle during the wire bonding process, i.e. the provision of the bonding wires. Said wire bonding may take place in a known manner. Electrical connections between integrated circuits on a solid-state image sensor and electrical connections on a substrate may also be effected in a different manner, for example by means of stud bumps. One drawback of the use of stud bumps, however, is the fact that they require larger pads, and thus more space, on the solid-state image sensor 113.

FIGS. 4A-C schematically show a further manufacturing step of the camera module according to the invention. FIG. 4A is a side elevation, which shows the same elements as in FIG. 3A. FIG. 4B is a top plan view which shows, in addition to the elements that are present in FIG. 3B, the adhesive material 104 after it has been applied to the substrate 105. The adhesive material 104 has been applied in the direct vicinity of the corners of the main surface 123 of the solid-state image sensor 113, thereby forming an at least substantially rectangular pattern on the substrate 105 along the circumference of the solid-state image sensor 113 that is present on the substrate 105. FIG. 4C is a perspective view which shows, in addition to the elements that are shown in FIG. 3C, the adhesive material 104 after it has been applied to the substrate 105. The adhesive material 104 may be a glue which is commonly used for this purpose.

FIGS. 5A-C schematically show a further manufacturing step of the camera module according to the invention. FIG. 5A is a schematic, perspective view of the holder 102, seen from the side that is placed into abutment with the substrate 105. The figure shows the bulges 131 that are present near the corners of outer wall 126 of the holder 102. As the figure shows, the bulges 131 extend beyond the end 122 of the light-conducting channel 121. The bulges 131 are provided with an L-shaped recess 132, seen in sectional view in a direction perpendicular to the central axis, so that the bulges 131 are likewise L-shaped, seen in the same sectional view. Once the assembly of the camera module is complete, the central axis of the holder 102 extends parallel to the optical axis 106, as is shown in FIG. 1B. Each of the bulges 131 has an end 500 extending in a plane perpendicular to the central axis of the holder 102. Said ends jointly form a bonding area, which is oriented perpendicularly to the central axis of the holder 102. As is furthermore shown in FIG. 5A, the diameter of the holder 102 decreases towards the end 122 of the light-conducting channel 121.

FIG. 5B is an enlarged view of one of the bulges 131 and an adjoining part of the inner wall 130 of the holder 102 and the bonding area 123. FIG. 5B furthermore shows more clearly that the bulges 131 extend beyond the end of the light-conducting channel 121. Each of the bulges 131 has an end 500, which extends in a plane perpendicular to the central axis of the holder 102. Said ends jointly form a bonding area, which is oriented perpendicularly to the central axis of the holder 102. FIG. 5B furthermore shows that the bulges 131 are provided on the inner side with the L-shaped recesses 132 facing towards the central axis of the holder 102.

The L-shaped recesses 132 comprise a surface 501, which is oriented perpendicularly to the central axis of the holder 102 and, after assembly, also perpendicularly to the optical axis 106, therefore. The surfaces 501 of the recesses 132 jointly form an abutting surface, which is likewise oriented perpendicularly to the central axis of the holder 102. Upon assembly of the camera module, the main surface 123 of the solid-state image sensor 113 is placed into contact with the abutting surface. As a result, the image pick-up section 114 of the solid-state image sensor 113 will extend perpendicularly to the optical axis 106 in the assembled camera module 100, and that at a predetermined distance from the lens 112. The advantage of the fact that the image pick-up section 114 extends perpendicularly to the optical axis 106 is that it leads to an improved quality of the images being projected onto the image pick-up section 114 by the lens 112. It is possible to arrange the light-sensitive elements of the image pick-up section 114 such that they will lie more precisely in the focal plane of the lens 112. The advantage of the fact that the image pick-up section 114 is spaced from the lens 112 by a predetermined distance is that it is not necessary to focus the lens 112 if the tolerances in the dimensions of the barrel 101 and the lens 112 are sufficiently small. Normally, said focusing takes place when the barrel 101 is placed in the holder 102. Since this must be done with fairly great precision, it generally takes up much time, with relatively costly equipment being required. The possibility to omit the focusing step thus leads to a simplification of the assembly and thereby to a reduction of the cost of production.

FIG. 5B furthermore shows that the end 122 of the light-conducting channel 121 is provided with recesses 502. This achieves that the main surface 123 of the solid-state image sensor 133 will only abut against the surfaces 501 in the recesses 132 of the bulges 131 after the solid-state image sensor 113 has been placed in the holder 102. This prevents any unevennesses in the main surface of the solid-state image sensor or in the end of the light-conducting channel leading to the build-up of mechanical stresses in the solid-state image sensor. Such stresses may reduce the life of the solid-state image sensor 113 or even cause damage to the solid-state image sensor 113. A depth of the recesses 502 of a few micron is already sufficient. The solid-state image sensor 113 may be fixed in position in the holder 102 in a usual manner, for example by means of a suitable glue. After the adhesive material 104 has been applied to the substrate 105, the holder 102 is placed over the solid-state image sensor 113 on the substrate 105. On the other hand, it may be advantageous to arrange the assembly comprising the solid-state image sensor 113 and the substrate 105 inside the holder 102.

FIGS. 6A-C schematically show a further manufacturing step of the camera module according to the invention. FIG. 6A is a side elevation of the holder 102, which is attached to the substrate 105 by means of the adhesive material 104, with the stiffener 200 being present on the other side of the substrate. In the side elevation shown, the solid-state image sensor 113 is disposed under the end 122 of the light-conducting channel 121, as a result of which also one of the lateral surfaces 125 of the solid-state image sensor 113 and the bonding wires 116 which are connected to the bond pads 115 are present on the main surface 123 near the lateral surface shown. FIG. 6B is a top plan view of the holder 102 attached to the substrate 105 by means of the adhesive material 104. The adhesive material 104 may partially extend outside the planes 500 of the bulges 131. This simplifies the application of the adhesive material to the substrate 105 in a previous step, since a proper bond remains ensured, also if the application of the adhesive material takes place relatively inaccurately. Furthermore, part of the solid-state image sensor 113 and the image pick-up section 114 present thereon can be seen via the light-conducting channel 121.

FIG. 6C shows in perspective view the holder 102, which is attached to the substrate 105 via the adhesive material 104, with the stiffener 200 being present on the other side of the substrate 105.

Figs. 7A-C schematically show a further manufacturing step of the camera module according to the invention. FIG. 7A is a side elevation which shows, in addition to the elements that are shown in FIG. 6A, the glob top material 103 which abuts both the outer side of the holder 102 and the substrate 105, and which screens and strengthens the joint between the two. Said glob top material also strengthens the connection between the holder 102 and the substrate 105. FIG. 7B is a top plan view which shows, in addition to the elements that are shown in FIG. 6A, the glob top material 103. FIG. 7C is a perspective view which shows, in addition to the elements that are shown in FIG. 6C, the glob top material 103 as an edge that extends around the holder 102.

The viscosity of the glob top material 103 being used must not be too low upon application thereof, since otherwise the material will not remain in contact with the outer side of the holder 102 to a sufficient degree. The provision of the glob top material may be omitted under certain circumstances, if the adhesive material 104 itself provides a sufficiently strong connection between the holder 102 and the substrate 105 and if it is not necessary to seal the remaining openings between the light-conducting channel 121 and the solid-state image sensor. It is also possible not to apply the glob top material 103 until the barrel 101 containing the lens 112 has been placed in the holder 102. Since the glob top material 103 must generally be cured at a relatively high temperature, however, this means that the material of the lens 112 must be capable of withstanding said high temperature.

FIGS. 8A-C schematically show a further manufacturing step of the camera module according to the invention. FIG. 8A is a side elevation which shows, in addition to the elements that are shown in FIG. 7A, the barrel 101 containing the lens 112. FIG. 8B is a top plan view which shows, in addition to the elements that are present in FIG. 7B, the barrel 101 that is mounted in the holder 102, which barrel contains the lens 112. FIG. 8C is a perspective view which shows, in addition to the elements that are shown in FIG. 7C, the barrel 101 that is mounted in the holder 102, which barrel contains the lens 112.

If necessary, for example owing to relatively large tolerances in the dimensions, the lens 101 may be focused with respect to the image pick-up section 114 of the solid-state image sensor 113, after which the barrel 101 is fixed in position with respect to the holder 102 in a usual manner, for example by means of suitably selected glue, or by means of laser welding or an ultrasonic welding technique. If the tolerances in the dimensions of the lens 112 and the barrel are sufficiently small, said focusing may be omitted, and it suffices to place the barrel 101 in the holder 102.

It will be understood that the invention is not limited to the examples that are given herein, but that a great many additional variants are possible within the scope of the invention. Thus, the order in which the various elements of the camera module 100 are assembled may be adapted as the production circumstances require. Furthermore it will be understood that whilst a barrel containing one lens is shown in the embodiments that are shown herein, it is possible to substitute said lens for a system of lenses. It will also be understood that the substrate 105 does not necessarily have to be a flexible foil, but that it is also possible to use a usual PCB (printed circuit board) material for this purpose. One advantage of the use of a PCB substrate is the fact that it makes it easier to test the camera module, since it is relatively easy to attach test pads thereto. This may be done on an unused portion on the side of the substrate to which the holder 102 is attached. In many cases it is also possible to attach the test pads to the substrate on the other side thereof.

In summary, the invention relates to a camera module 100. The camera module 100 comprises a holder 102, which is provided with a light-conducting channel 121. Present in said light-conducting channel 121 is a lens 112 having an optical axis 106. Disposed near an end 122 of the light-conducting channel 121 is a solid-state image sensor 113, which is provided with an image pick-up section 114 that is oriented perpendicularly to the optical axis 106. Aligning means 131 forming part of the holder 102 are present near the end 122 of the light-conducting channel 121. Said aligning means align the image sensor 114 with respect to the optical axis 106. In one embodiment of the camera module 100, the outer wall 126 of the holder 102 is substantially rectangular near the end 122, seen in sectional view in a direction perpendicular to the optical axis 106, and the aligning means are formed by bulges 131 that are disposed near the corners of the rectangle. The bulges 131 are provided with a recess 132, which abuts the lateral surfaces 125 of the solid-state image sensor 113 substantially without play. This manner of aligning the image pick-up section 114 with respect to the optical axis simplifies the manufacture of the camera module 100.

The invention claimed is:

1. A camera module comprising a holder provided with a light-conducting channel, within which channel a lens having an optical axis is present, a solid-state image sensor being present near an end of said light-conducting channel, which image sensor comprises an image pick-up section oriented perpendicularly to the optical axis, characterized in that aligning means forming part of the holder are present near the end of the light-conducting channel, which aligning means align the image pick-up section with respect to the optical axis, wherein the image pick-up section extends in a plane parallel to a main surface of the solid-state image sensor, the solid-state image sensor comprising lateral surfaces oriented at least substantially perpendicularly to the main surface, and the holder comprising an outer wall which is at least substantially polygonal near the end, seen in sectional view in a direction perpendicular to the optical axis, the aligning means comprising bulges present on the outer wall, near the corners of said polygon, the bulges extending beyond the end of the light-conducting channel, having an inner side which abuts against at least one of the lateral surfaces of the solid-state image sensor, the solid-state image sensor being within the holder substantially without play in a direction perpendicular to the optical axis, wherein each of the bulges have an end that jointly form a bonding area which is oriented at least substantially perpendicularly to the optical axis, wherein the holder near the end of the light-conducting channel includes recesses so that the main surface of the solid-state image sensor does not make contact with the holder at the recesses, the solid-state image sensor contacting the holder only at inner sides and top surfaces of the bulges, the top surfaces being perpendicular to the inner sides which abut against the lateral surfaces of the solid-state image sensor.

2. A camera module as claimed in claim 1, characterized in that said polygon is a rectangle.

3. A camera module according to claim 1, characterized in that the inner side of the bulges comprises an L-shaped recess, as a result of which each bulge abuts substantially without play against two mutually adjacent lateral surfaces of the solid-state image sensor.

4. A camera module as claimed in claim 3, characterized in that the L-shaped recesses furthermore each comprises a surface extending parallel to a plane perpendicularly to the optical axis, which surfaces jointly form an abutting surface against which the main surface of the solid-state image sensor abuts substantially without play, thereby determining the distance from the image pick-up section to the lens.

5. A camera module as claimed in claim 1, characterized in that the camera module comprises a substrate, in which the solid-state image sensor is provided with a second main surface bonded to the substrate, in which the substrate is bonded to the bonding area formed by the ends of the bulges by means of an adhesive material.

6. A camera module as claimed in claim 1, characterized in that the main surface of the solid-state image sensor and the polygon are at least substantially identical in shape, with the polygon having a smaller surface area, as a result of which a part of the main surface located near the lateral surfaces lies further away from the optical axis than, near the end of the light-conducting channel, the outer wall of the holder.

7. A holder for use in a camera module, which holder is provided with a light-conducting channel, which is arranged for accommodating a lens having an optical axis and which is furthermore arranged for placing a solid-state image sensor comprising an image pick-up section near an end of the light-conducting channel, characterized in that aligning means forming part of the holder are present near said end of the light-conducting channel for aligning the image pick-up section with respect to the optical axis, wherein the image pick-up section extends in a plane parallel to a main surface of the solid-state image sensor, the solid-state image sensor comprising lateral surfaces oriented at least substantially perpendicularly to the main surface, and the holder comprising an outer wall which is at least substantially polygonal near the end, seen in sectional view in a direction perpendicular to the optical axis, the aligning means comprising bulges present on the outer wall, near the corners of said polygon, bulges extending beyond the end of the light-conducting channel, having an inner side which abuts against at least one of the lateral surfaces of the solid-state image sensor, the solid-state image sensor being within the holder substantially without play in a direction perpendicular to the optical axis, wherein each of the bulges have an end that jointly form a bonding area which is oriented at least substantially perpendicularly to the optical axis, wherein the holder near the end of the light-conducting channel includes recesses so that the main surface of the solid-state image sensor does not make contact with the holder at the recesses, the solid-state image sensor contacting the holder only at inner sides and top surfaces of the bulges, the top surfaces being perpendicular to the inner sides which abut against the lateral surfaces off the solid-state image sensor.

8. A camera system comprising a camera module with a holder provided with a light-conducting channel in which a lens having an optical axis is present, in which a solid-state image sensor provided with an image pick-up section oriented perpendicularly to the optical axis is present near an end of the light-conducting channel, and in which aligning means forming part of the holder are present near said end of the light-conducting channel for aligning the image pick-up section with respect to the optical axis, characterized in that the image pick-up section extends in a plane parallel to a main surface of the solid-state image sensor, the solid-state image sensor comprising lateral surfaces oriented at least substantially perpendicularly to the main surface, and the holder comprising an outer wall which is at least substantially polygonal near the end, seen in sectional view in a direction perpendicular to the optical axis, in which the aligning means comprise bulges present on the outer wall, near the corners of said polygon, which bulges extend beyond the end of the light-conducting channel, having an inner side which abuts against at least one of the lateral surfaces of the solid-state image sensor, as a result of which the solid-state image sensor is contained within the holder substantially without play in a direction perpendicular to the optical axis, wherein each of the bulges have an end that jointly form a bonding area which is oriented at least substantially perpendicularly to the optical axis, wherein the holder near the end of the light-conducting channel includes recesses so that the main surface of the solid-state image sensor does not make contact with the holder at the recesses, the solid-state image sensor contacting the holder only at inner sides and top surfaces of the bulges, the top surfaces being perpendicular to the inner sides which abut against the lateral surfaces of the solid-state image sensor.

9. A method of manufacturing a camera module comprising a holder provided with a light-conducting channel, characterized in that the holder is provided with aligning means, in which a solid-state image sensor being present near an end of the light-conducting channel comes into contact with the aligning means upon placement of the solid-state image sensor in said holder, as a result of which an image pick-up section present on the solid-state image sensor is aligned with respect to an optical axis, wherein the image pick-up section extends in a plane parallel to a main surface of the solid-state image sensor, the solid-state image sensor comprising lateral surfaces oriented at least substantially perpendicularly to the main surface, and the holder comprising an outer wall which is at least substantially polygonal near the end, seen in sectional view in a direction perpendicular to the optical axis, the aligning means comprising bulges present on the outer wall, near the corners of said polygon, the bulges extending beyond the end of the light-conducting channel, having an inner side which abuts against at least one of the lateral surfaces of the solid-state image sensor, the solid-state image sensor being within the holder substantially without play in a direction perpendicular to the optical axis, wherein each of the bulges have an end that jointly form a bonding area which is oriented at least substantially perpendicularly to the optical axis, wherein the holder near the end of the light-conducting channel includes recesses so that the main surface of the solid-state image sensor does not make contact with the holder at the recesses, the solid-state image sensor contacting the holder only at inner sides and to surfaces of the bulges, the to surfaces being perpendicular to the inner sides which abut against the lateral surfaces of the solid-state image sensor.

10. A camera module comprising:
a lens;
a sensor; and
a holder configured to hold the lens at a first end and contact the sensor at a second end, wherein the second end includes bulges at corners that extend beyond the sensor, the bulges having side surfaces and top surfaces perpendicular to the side surfaces;
the second end further including recesses between the top surfaces so that the sensor does not make contact with the holder at the recesses, the sensor contacting the holder only at the side surfaces and the top surfaces.

11. The camera module of claim 10, wherein the holder comprises a light channel between the lens and the sensor, a diameter of the light channel decreasing from the lens to the sensor.

* * * * *